(12) United States Patent
Daycock et al.

(10) Patent No.: US 10,541,252 B2
(45) Date of Patent: Jan. 21, 2020

(54) MEMORY ARRAYS, AND METHODS OF FORMING MEMORY ARRAYS

(71) Applicant: Micron Technology, Inc., Boise, ID (US)

(72) Inventors: David Daycock, Boise, ID (US); Richard J. Hill, Boise, ID (US); Christopher Larsen, Boise, ID (US); Woohee Kim, Meridian, ID (US); Justin B. Dorhout, Boise, ID (US); Brett D. Lowe, Boise, ID (US); John D. Hopkins, Meridian, ID (US); Qian Tao, Boise, ID (US); Barbara L. Casey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/410,973

(22) Filed: May 13, 2019

(65) Prior Publication Data
US 2019/0267396 A1    Aug. 29, 2019

Related U.S. Application Data

(63) Continuation of application No. 16/031,919, filed on Jul. 10, 2018, now Pat. No. 10,304,853, which is a
(Continued)

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 29/1037* (2013.01); *H01L 29/40117* (2019.08); *H01L 29/4234* (2013.01); *H01L 29/7926* (2013.01)

(58) Field of Classification Search
CPC .......... H01L 27/11582; H01L 29/1037; H01L 29/4234; H01L 29/7926; H01L 21/28282
See application file for complete search history.

(56) References Cited

U.S. PATENT DOCUMENTS 7,829,938 B2   11/2010   Bhattacharyya
8,462,557 B2   6/2013    Bhattacharyya
(Continued)

FOREIGN PATENT DOCUMENTS

KR   10-2008-0027946   3/2008
KR   10-2012-0007838   1/2012
(Continued)

*Primary Examiner* — Christine A Enad
(74) *Attorney, Agent, or Firm* — Wells St. John P.S.

(57) ABSTRACT

Some embodiments include a memory array which has a vertical stack of alternating insulative levels and wordline levels. The wordline levels have terminal ends corresponding to control gate regions. Charge-trapping material is along the control gate regions of the wordline levels and not along the insulative levels. The charge-trapping material is spaced from the control gate regions by charge-blocking material. Channel material extends vertically along the stack and is laterally spaced from the charge-trapping material by dielectric material. Some embodiments include methods of forming NAND memory arrays.

17 Claims, 14 Drawing Sheets

Related U.S. Application Data continuation of application No. 15/422,335, filed on Feb. 1, 2017, now Pat. No. 10,083,981.

(51) Int. Cl.
  *H01L 29/423* (2006.01)
  *H01L 21/28* (2006.01)
  *H01L 29/10* (2006.01)
  *H01L 29/792* (2006.01)

(56) References Cited

U.S. PATENT DOCUMENTS

| | | |
|---|---|---|
| 8,643,084 B2 | 2/2014 | Shin et al. |
| 8,658,499 B2 | 2/2014 | Makala et al. |
| 8,912,591 B2 | 12/2014 | Baek et al. |
| 8,933,501 B2 | 1/2015 | Makala et al. |
| 9,093,321 B2 | 7/2015 | Makala et al. |
| 9,136,130 B1 | 9/2015 | Wada |
| 9,177,965 B2 | 11/2015 | Lee et al. |
| 9,305,937 B1 | 4/2016 | Tsutsumi et al. |
| 9,362,303 B2 | 6/2016 | Lee et al. |
| 9,478,558 B2 | 10/2016 | Koka et al. |
| 9,620,512 B1 | 4/2017 | Nishikawa et al. |
| 9,627,399 B2 | 4/2017 | Kanakamedala et al. |
| 9,659,949 B2 | 5/2017 | Zhu et al. |
| 9,711,229 B1 | 7/2017 | Rabkin et al. |
| 9,728,546 B2 | 8/2017 | Serov et al. |
| 9,741,737 B1 | 8/2017 | Huang et al. |
| 9,922,992 B1 | 3/2018 | Yu et al. |
| 9,965,049 B2 | 5/2018 | Sandhu et al. |
| 2007/0012988 A1 | 1/2007 | Bhattacharyya |
| 2011/0147823 A1* | 6/2011 | Kuk ............... H01L 27/11551 257/324 |
| 2011/0273931 A1 | 11/2011 | Bhattacharyya |
| 2012/0001249 A1 | 1/2012 | Alsmeier et al. |
| 2012/0104484 A1 | 5/2012 | Lee et al. |
| 2012/0156848 A1 | 6/2012 | Yang et al. |
| 2013/0148398 A1 | 6/2013 | Baek et al. |
| 2014/0008714 A1 | 1/2014 | Makala et al. |
| 2014/0138760 A1 | 5/2014 | Makala et al. |
| 2014/0231954 A1 | 8/2014 | Lue |
| 2014/0264532 A1 | 9/2014 | Dennison et al. |
| 2014/0339624 A1 | 11/2014 | Ramaswamy |
| 2015/0069494 A1 | 3/2015 | Makala et al. |
| 2015/0294980 A1 | 10/2015 | Lee et al. |
| 2015/0364483 A1 | 12/2015 | Koval |
| 2016/0056168 A1 | 2/2016 | Lue |
| 2016/0126248 A1 | 5/2016 | Rabkin |
| 2016/0149004 A1 | 5/2016 | Rabkin |
| 2016/0181272 A1 | 6/2016 | Rabkin |
| 2016/0190155 A1 | 6/2016 | Lee et al. |
| 2016/0211272 A1 | 7/2016 | Koka et al. |
| 2016/0233225 A1 | 8/2016 | Zhu et al. |
| 2016/0268209 A1 | 9/2016 | Pachamuthu et al. |
| 2016/0284719 A1 | 9/2016 | Zhu et al. |
| 2016/0293621 A1 | 10/2016 | Huang |
| 2016/0365407 A1 | 12/2016 | Lue |
| 2017/0025431 A1 | 1/2017 | Kanakamedala et al. |
| 2017/0125436 A1 | 5/2017 | Sharangpani et al. |
| 2017/0229470 A1 | 8/2017 | Zhu et al. |
| 2017/0236896 A1 | 8/2017 | Lu et al. |
| 2017/0243650 A1 | 8/2017 | Ogawa et al. |
| 2017/0278859 A1* | 9/2017 | Sharangpani ..... H01L 27/11573 |
| 2017/0373197 A1 | 12/2017 | Sharangpani et al. |
| 2018/0090373 A1 | 3/2018 | Sharangpani et al. |
| 2018/0226425 A1 | 8/2018 | Purayath |
| 2018/0269229 A1 | 9/2018 | Or-Bach |

FOREIGN PATENT DOCUMENTS

| | | |
|---|---|---|
| KR | 10-2014-0114536 | 9/2014 |
| WO | WO 2016/025192 | 2/2016 |
| WO | WO PCT/US2018/016144 | 4/2018 |
| WO | WO PCT/US2018/016468 | 5/2018 |
| WO | WO PCT/US2018/016488 | 5/2018 |
| WO | WO PCT/US2018/016144 | 8/2019 |
| WO | WO PCT/US2018/016468 | 8/2019 |

\* cited by examiner

MEMORY ARRAYS, AND METHODS OF FORMING MEMORY ARRAYS

RELATED PATENT DATA

This application resulted from a continuation of U.S. patent application Ser. No. 16/031,919 which was filed Jul. 10, 2018, which is a continuation of U.S. patent application Ser. No. 15/422,335 which was filed Feb. 1, 2017, which are hereby incorporated by reference.

TECHNICAL FIELD

Memory arrays, and methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

DETAILED DESCRIPTION OF THE ILLUSTRATED EMBODIMENTS

Operation of NAND memory cells may comprise movement of charge between a channel material and a charge-trapping material. For instance, programming of a NAND memory cell may comprise moving charge (i.e., electrons) from the channel material into the charge-trapping material, and then storing the charge within the charge-trapping material. Erasing of the NAND memory cell may comprise moving holes into the charge-trapping material to recombine with electrons stored in the charge-trapping material, and thereby release charge from the charge-trapping material. The charge-trapping material may comprise, for example, silicon nitride, silicon oxynitride, ruthenium oxide, etc. A problem with conventional NAND can be that charge-trapping material extends across multiple memory cells of a memory array, and can enable charge migration between the cells. The charge migration between memory cells may lead to data retention problems. Some embodiments include structures which impede migration of charge between memory cells. In example embodiments, the structures utilized to impede charge migration may be breaks in the charge-trapping material in regions between memory cells. Although examples described herein pertain to NAND memory, it is to be understood that structures and methods described herein may pertain to other memory and architectures in other embodiments. Example embodiments are described with reference to FIGS. 1-14.

Figure 1:
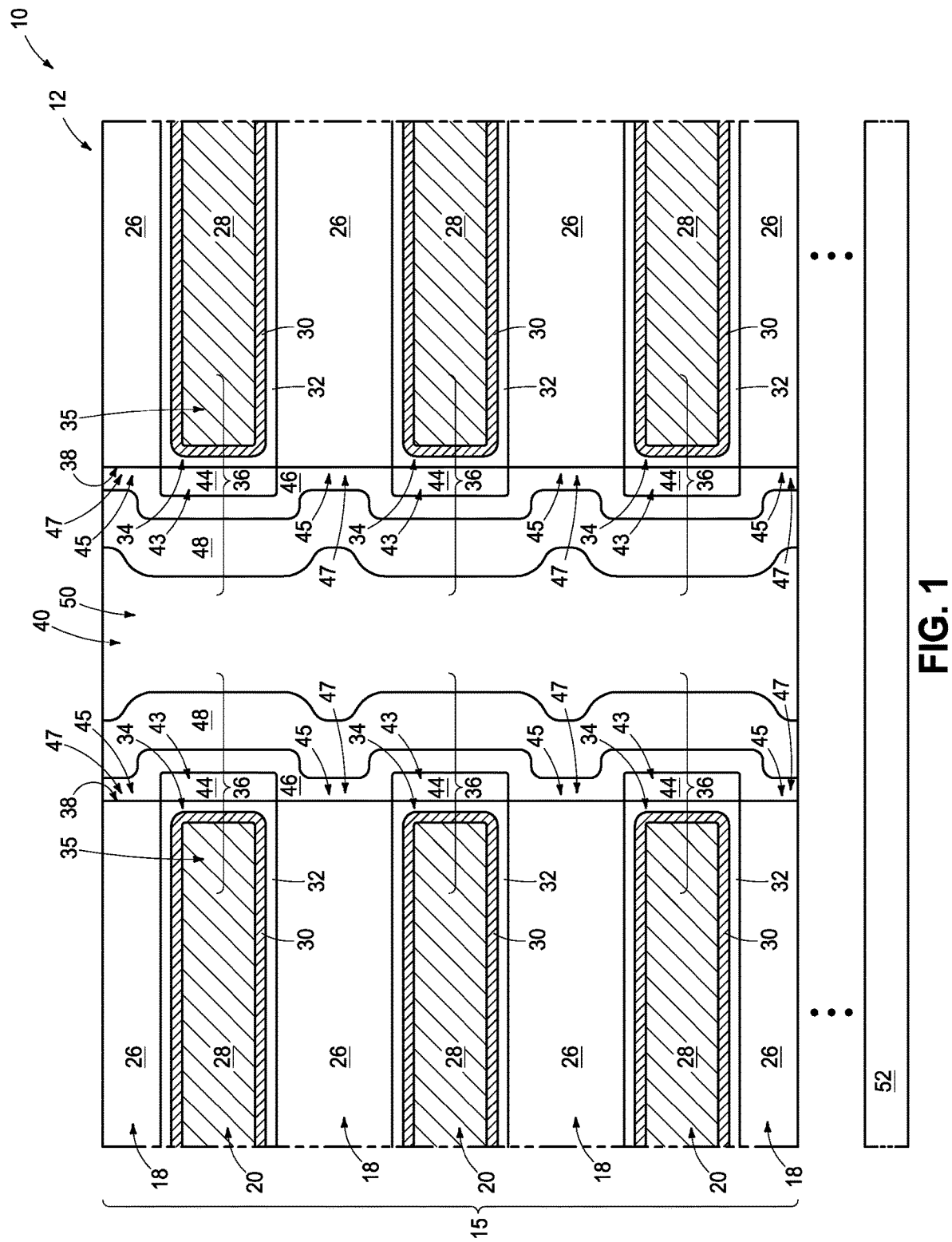
FIG. 1 is a diagrammatic cross-sectional side view of an example integrated structure having a region of an example NAND memory array.

Referring to FIG. 1, a portion of an integrated structure 10 is illustrated, with such portion including a fragment of a three-dimensional NAND memory array 12.

The integrated structure 10 comprises a stack 15 of alternating first and second levels 18 and 20. The levels 18 are insulative (i.e. dielectric), and the levels 20 are conductive.

The insulative levels 18 comprise insulative material 26. Such insulative material may comprise any suitable composition or combination of compositions; and may, for example, comprise silicon dioxide.

The conductive levels 20 comprise conductive materials 28 and 30. The conductive material 28 may be considered to be a conductive core, and the conductive material 30 may be considered to be an outer conductive layer surrounding the conductive core. The conductive materials 28 and 30 may comprise different compositions than one another. In some embodiments, the conductive material 28 may comprise, consist essentially of, or consist of one or more metals (for instance, tungsten, titanium, etc.), and the conductive material 30 may comprise, consist essentially of, or consist of one or more metal-containing compositions (for instance, metal nitride, metal silicide, metal carbide, etc.). In some embodiments, the conductive material 30 may comprise, consist essentially of, or consist of one or more metal nitrides (for instance, titanium nitride, tungsten nitride, etc.).

The materials 28/30 illustrate an example configuration of the conductive levels 20. In other embodiments, the conductive levels 20 may comprise other configurations of conductive material; and may, for example, comprise a single conductive material or more than the illustrated two conductive materials. Generally, the conductive levels 20 may comprise conductive material having any suitable composition or combination of compositions; and may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.).

Insulative material 32 forms an insulative liner surrounding the outer conductive layer of material 30. The insulative material 32 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 32 is shown to be a single homogenous material, in other embodiments the insulative material may comprise two or more discrete compositions.

For instance, in some embodiments the insulative material 32 may comprise a laminate of silicon dioxide and one or more high-k materials.

In some embodiments, the conductive levels 20 may be considered to be wordline levels of a NAND memory array. Terminal ends 34 of the wordline levels 20 may function as control gate regions 35 of NAND memory cells 36, with approximate locations of the memory cells 36 being indicated with brackets in FIG. 1.

The conductive levels 20 and insulative levels 18 may be of any suitable vertical thicknesses. In some embodiments, the conductive levels 20 and the insulative levels 18 may have vertical thicknesses within a range of from about 10 nanometers (nm) to about 300 nm. In some embodiments, the conductive levels 20 may have about the same vertical thicknesses as the insulative levels 18. In other embodiments, the conductive levels 20 may have substantially different vertical thicknesses than the insulative levels 18.

The vertically-stacked memory cells 36 form a vertical string (such as, for example, a vertical NAND string of memory cells), with the number of memory cells in each string being determined by the number of conductive levels 20. The stack may comprise any suitable number of conductive levels. For instance, the stack may have 8 conductive levels, 16 conductive levels, 32 conductive levels, 64 conductive levels, 512 conductive levels, 1028 conductive levels, etc.

The insulative materials 26 and 32 may be considered to form sidewalls 38 of an opening 40 extending through stack 15. The opening 40 may have a continuous shape when viewed from above; and may be, for example, circular, elliptical, etc. Accordingly, the sidewalls 38 of FIG. 1 may be comprised by a continuous sidewall that extends around the periphery of opening 40.

The insulative material 32 may be considered to be a charge-blocking material, with regions of such charge-blocking material 32 extending along the terminal ends 34 of wordline levels 20. A charge-blocking material may have the following functions in a memory cell: in a program mode, the charge-blocking material may prevent charge carriers from passing out of the charge-storage material (e.g., floating-gate material, charge-trapping material, etc.) toward the control gate; and in an erase mode, the charge-blocking material may prevent charge carriers from flowing into the charge-storage material from the control gate.

Charge-trapping material 44 extends along the terminal ends 34 (i.e., control gate regions 35) of wordline levels 20, and is spaced from the control gate regions by the charge-blocking material 32. The charge-trapping material 44 may comprise any suitable composition or combination of compositions; and in some embodiments, may comprise one or more of silicon nitride, silicon oxynitride, ruthenium oxide, etc. In some example embodiments, the charge-trapping material 44 may comprise, consist essentially of, or consist of material comprising silicon and nitrogen. In some aspects, a "charge trap" refers to an energy well that can reversibly capture a charge carrier (e.g., an electron or hole).

The charge-trapping material 44 is provided in segments 43 which are arranged one atop another (i.e., are vertically stacked), and which are vertically spaced from one another by gaps 45. Each of the segments 43 of the charge-trapping material 44 is adjacent a wordline level 20, and each of the gaps 45 is adjacent one of the insulative levels 18. In the shown embodiment, the segments 43 of charge-trapping material 44 do not extend vertically beyond the wordline levels 20 (i.e., do not vertically overlap the insulative levels 18). In other embodiments, the segments 43 of charge-trapping material 44 may extend vertically beyond the conductive levels 20 to partially overlap the insulative levels 18.

The gaps 45 may be referred to as intervening regions which block charge migration between the segments 43 of charge-trapping material 44. Such prevents charge from migrating between vertically-adjacent memory cells 36. In contrast, conventional three-dimensional NAND memory arrays may have a continuous layer of charge-trapping material extending along all of the vertically-stacked memory cells of a NAND string, and such may undesirably enable charge-migration between the memory cells of the string and lead to data loss. The embodiment of FIG. 1 may have improved data retention as compared to such conventional three-dimensional NAND memory arrays.

Charge-tunneling material 46 extends vertically along the charge-trapping material 44, and extends into the gaps 45. The charge-tunneling material 46 may comprise any suitable composition or combination of compositions; and in some embodiments may comprise, consist essentially of, or consist of a bandgap-engineered structure having nitrogen-containing material laterally sandwiched between two oxides. The nitrogen-containing material may be, for example, silicon nitride. The two oxides may be the same composition as one another, or may comprise different compositions relative to one another; and in some embodiments may both be silicon dioxide. The charge-tunneling material 46 may be considered to comprise gate-dielectric material in some embodiments. The charge-tunneling material 46 may comprise, consist essentially of, or consist of silicon dioxide in some embodiments. In operation, charge may tunnel through the charge-tunneling material 46 as charge is transferred between the charge-trapping material 44 and channel material (material 48, which is described below) of the memory cells 36 during programming operations, erasing operations, etc. In some embodiments, the charge-tunneling material 46 may be referred to simply as an insulative material or as a dielectric material.

The charge-tunneling material 46 is referred to as "extending vertically" to indicate that it generally extends through the stack 15. The vertically-extending material 46 (and other materials described herein as extending vertically) may extend substantially orthogonally relative to upper surfaces of the levels 18 and 20 (as shown), or not; depending on, for example, whether opening 40 has sidewalls which are substantially orthogonal to the upper surfaces of the levels 18 and 20, or not.

In the illustrated embodiment, the charge-tunneling material 46 is within the gaps 45 between the segments 43 of charge-trapping material 44. In some embodiments, the charge-trapping material 44 may be considered to be configured as a linear arrangement which extends vertically along the stack 15; with such linear arrangement comprising the segments 43 of charge-trapping material 44 alternating with segments 47 of charge-tunneling material 46. The charge-tunneling material 46 within gaps 45 may be referred to as spacing material between the segments 43. Although the charge-tunneling material 46 is shown having regions which extend into the gaps 45 to form the segments 47 (i.e., to form the spacing material between segments 43), in other embodiments other insulative material may be within the gaps 45 and utilized as the spacing material between the segments 43. In such embodiments, the charge-tunneling material 46 may extend along such other insulative material, rather than extending into the gaps 45.

Channel material 48 extends vertically along the charge-tunneling material 46 (and, in some embodiments may be considered to extend vertically along the stack 15). The charge-tunneling material 46 is laterally between the channel material 48 and the charge-trapping material 44. The channel material 48 may comprise any suitable composition or combination of compositions; and in some embodiments may comprise, consist essentially of, or consist of appropriately-doped silicon.

In the illustrated embodiment, an insulative region 50 extends along a middle of opening 40. The insulative region 50 may comprise any suitable insulative composition; including, for example, silicon dioxide, silicon nitride, etc. Alternatively, at least a portion of the insulative region 50 may be a void. The illustrated embodiment having the insulative region 50 extending down the middle of opening 40 is a so-called hollow-channel configuration. In other embodiments, the channel material 48 may entirely fill the central region of opening 40 to form a vertically-extending pedestal within such central region.

The stack 15 is supported by a base 52. A break is provided between the base 52 and the stack 15 to indicate that there may be additional materials and/or integrated circuit structures between the base 52 and the stack 15. In some applications, such additional integrated materials may include, for example, source-side select gate material (SGS material).

The base 52 may comprise semiconductor material; and may, for example, comprise, consist essentially of, or consist of monocrystalline silicon. The base 52 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 52 may correspond to a semiconductor substrate containing one or more materials associated with integrated circuit fabrication. Such materials may include, for example, one or more of refractory metal materials, barrier materials, diffusion materials, insulator materials, etc.

Figure 2:
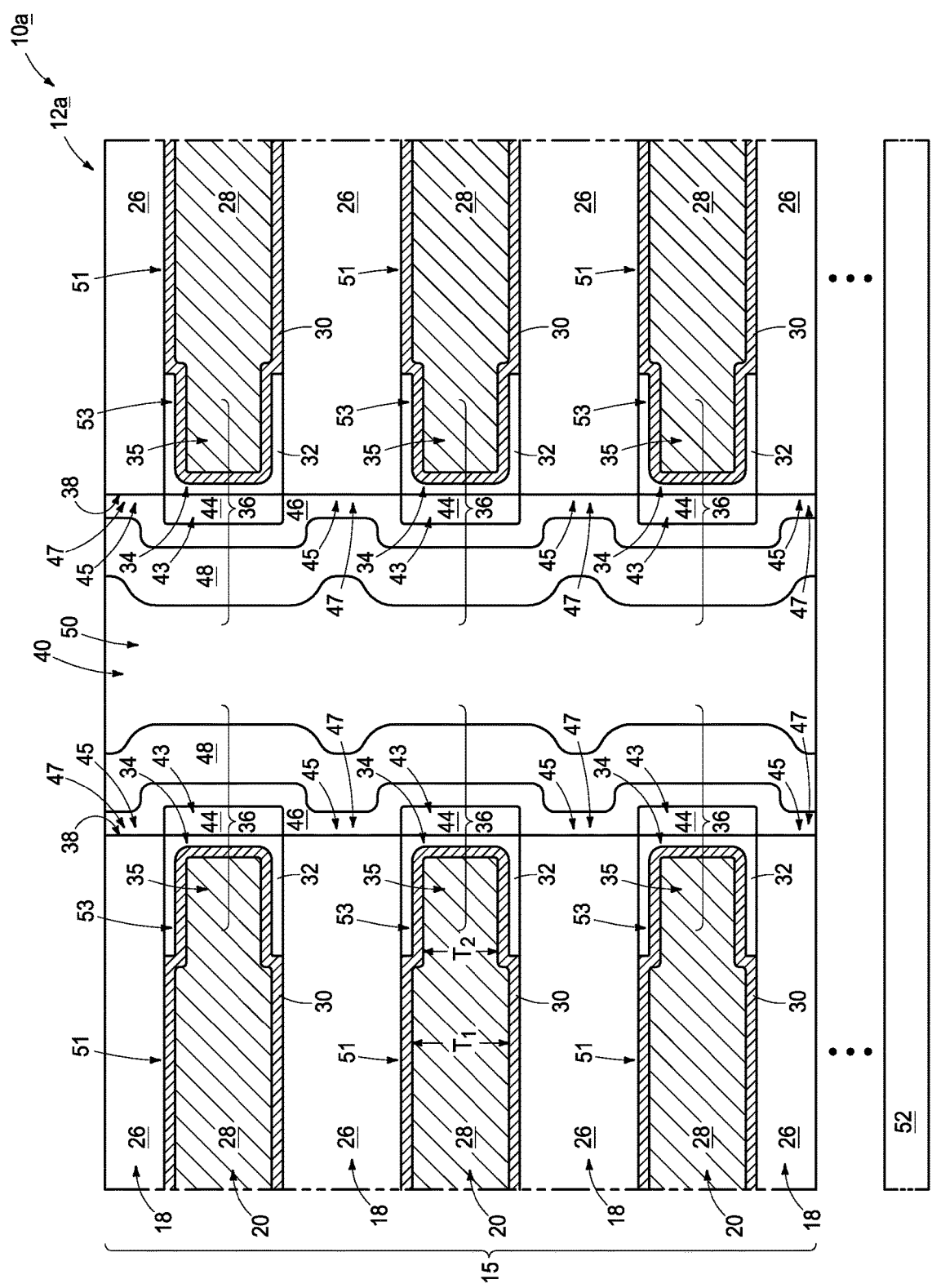
FIG. 2 is a diagrammatic cross-sectional side view of another example integrated structure having a region of another example NAND memory array.

FIG. 2 shows a construction 10a having a NAND memory array 12a illustrating another example configuration. The configuration of FIG. 2 is similar to that of FIG. 1, except that the insulative material 32 (i.e., the charge-blocking material) is only along terminal regions 53 of the wordline levels 20. Accordingly, each of the wordline levels 20 has a first region 51 (i.e., a non-terminal region) laterally adjacent a second region 53 (i.e., a terminal region), with the first regions 51 being vertically thicker than the second regions 53.

The insulative material 32 extends along a top and a bottom of each of the terminal regions 53 of the wordline levels 20, but is not along either the top or the bottom of each of the non-terminal regions 51 of the wordline levels 20. In the illustrated embodiment, the non-terminal regions 51 of the wordline levels 20 have vertical thicknesses $T_1$, and the terminal regions 53 of the wordline levels 20 have vertical thicknesses $T_2$. The vertical thickness $T_2$ is less than the vertical thickness $T_1$ by about double a thickness of the insulative material 32. The insulative material 32 may have any suitable thickness, and in some embodiments may have a thickness within a range of from about 5 nm to about 50 nm; and accordingly, in some embodiments the vertical thickness $T_2$ may less than the vertical thickness $T_1$ by a dimension within a range of from about 10 nm to about 100 nm. The embodiment of FIG. 2 may be advantageous relative to that of FIG. 1 in some applications, as the thick non-terminal regions 51 of the wordline levels 20 may enable the wordline levels to have lower resistance. Alternatively, the embodiment of FIG. 1 may be advantageous relative to that of FIG. 2 in some applications, as the embodiment of FIG. 1 may be fabricated with fewer process steps than that of FIG. 2.

The three-dimensional NAND configurations of FIGS. 1 and 2 may be fabricated utilizing any suitable methodology. Example methodology is described with reference to FIGS. 3-14. A first example embodiment method is described with reference to FIGS. 3-10.

Figure 3:
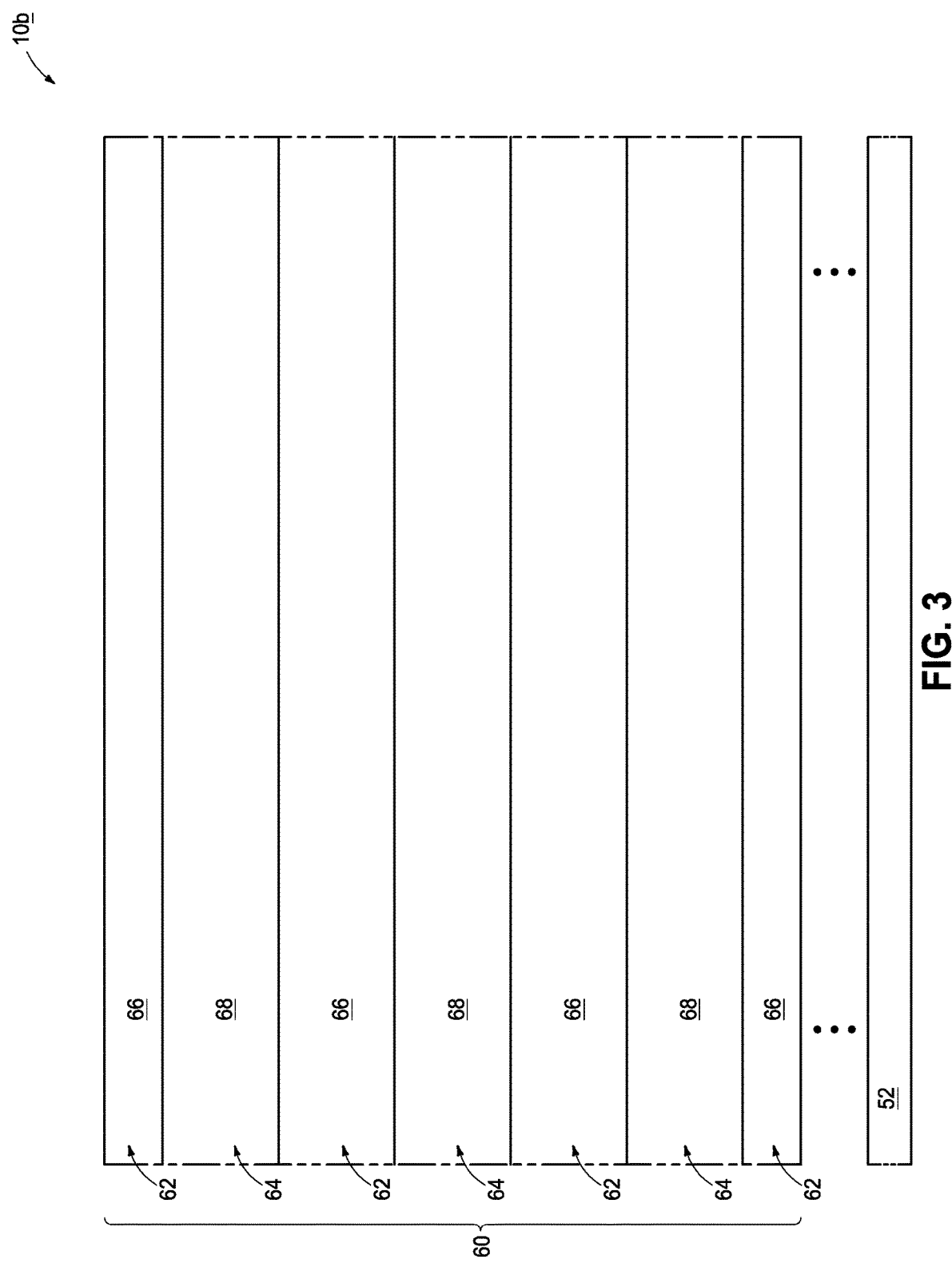
FIGS. 3-10 are diagrammatic cross-sectional side views of an example integrated structure at process stages of an example method.

Referring to FIG. 3, a construction 10b is formed to include a vertical stack 60 of alternating first levels 62 and second levels 64 over the base 52. The first levels 62 comprise first material 66, and the second levels 64 comprise second material 68. The first and second materials 66 and 68 may comprise any suitable compositions or combinations of compositions. In subsequent processing (described below with reference to FIG. 6) charge-trapping material 44 is selectively formed along the second material 68 relative to the first material 66. In some embodiments, the first material 66 comprises silicon dioxide, and accordingly may comprise the same material 26 as the insulative levels 18 of FIGS. 1 and 2; and the second material 68 comprises semiconductor material (for instance, silicon, germanium, etc.). In some example embodiments, the first material 66 comprises, consists essentially of, or consists of silicon dioxide; and the second material 68 comprises, consists essentially of, or consists of silicon (for instance, polycrystalline silicon, amorphous silicon, monocrystalline silicon, etc.).

Figure 4:
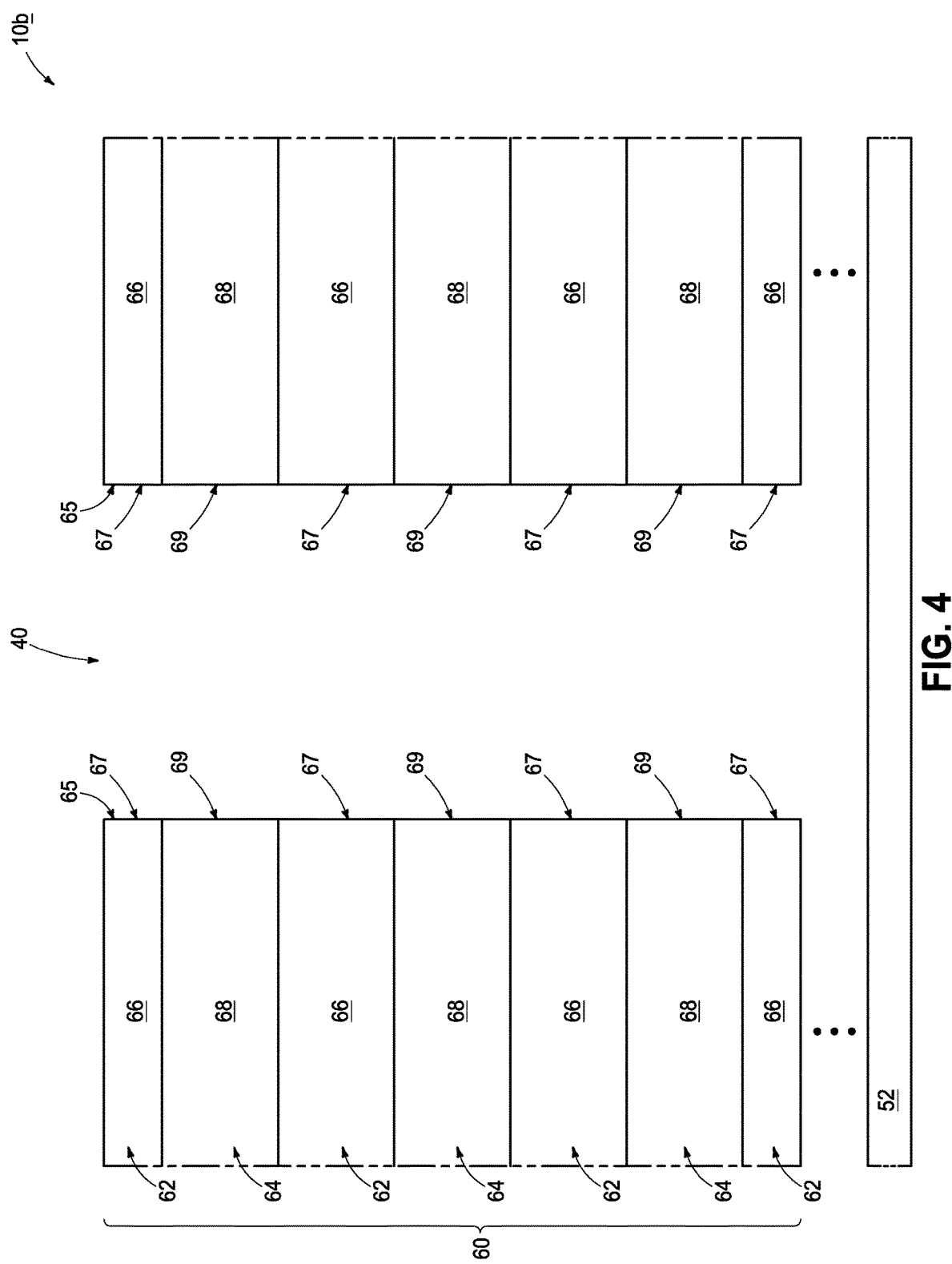

Referring to FIG. 4, the opening 40 is formed to extend through stack 60. The opening 40 may be formed utilizing any suitable methodology. For instance, a patterned mask (not shown) may be formed over the stack 60 to define a location of the opening 40, and then the opening 40 may be formed to extend through the stack 60 with one or more suitable etches. Subsequently, the patterned mask may be removed.

The opening 40 has sidewalls 65 extending along the first and second materials 66 and 68. The first levels 62 have first surfaces 67 exposed along the sidewalls 65, and the second levels 64 have second surfaces 69 exposed along the sidewalls 65.

Figure 5:
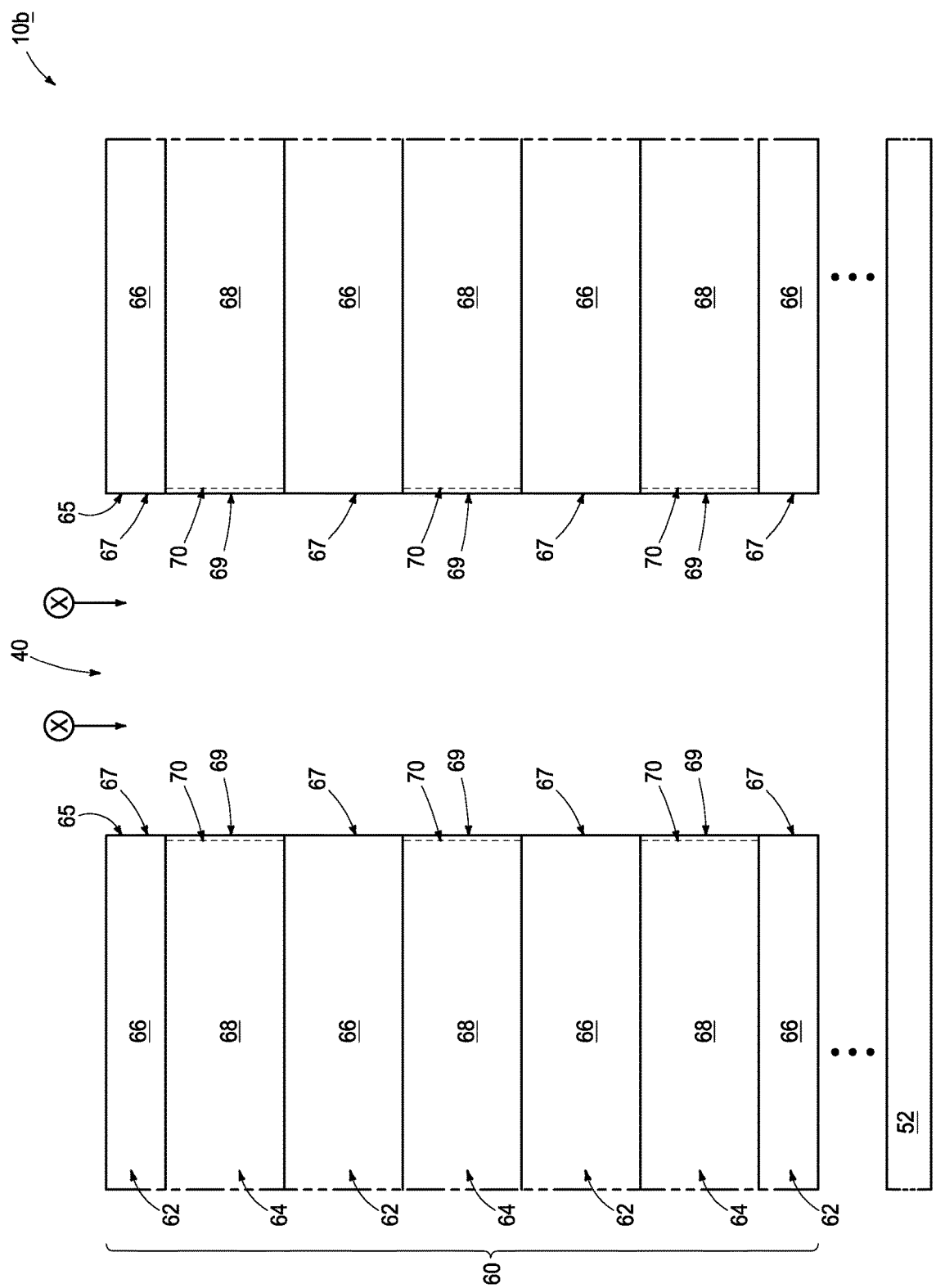

Referring to FIG. 5, treatment material "X" is flowed into opening 40. The treatment material "X" forms altered regions 70 (indicated diagrammatically with dashed lines) along the exposed surfaces 69 of the second material 68 of the second levels 64. In some embodiments, the second material 68 comprises silicon, and the treatment material "X" comprises one or more of the hydrogen, ammonia and fluorine. In such embodiments, the altered regions 70 may be regions in which native oxide is disrupted along surfaces 69, or entirely removed from the surfaces 69.

Figure 6:
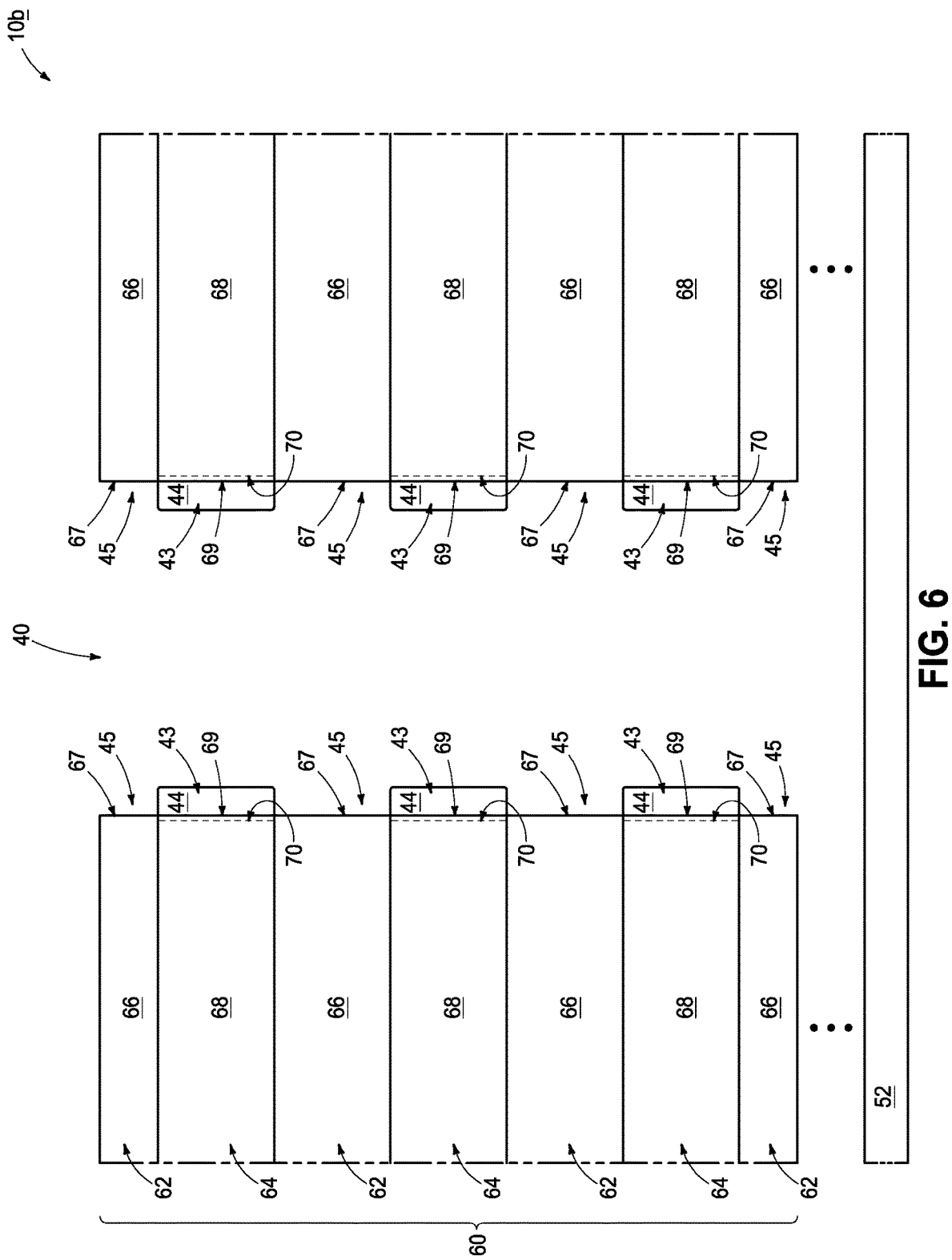

Referring to FIG. 6, charge-trapping material 44 is selectively formed along the treated surfaces 69 relative to the surfaces 67. The charge-trapping material 44 may comprise any suitable composition, and in some embodiments may comprise one or more of silicon nitride, silicon oxynitride and ruthenium oxide. In an example embodiment, the charge-trapping material comprises, consists essentially of, or consists of silicon nitride, and is selectively formed on treated surfaces 69 relative to surfaces 67 utilizing atomic layer deposition (ALD), and/or chemical vapor deposition (CVD), and/or any other suitable methods. Such methods may take advantage of different nucleation rates along treated surfaces 69 relative to surfaces 67, and/or may take advantage of other differences in physical properties of treated surfaces 69 relative to surfaces 67. In some embodiments, at least some of the silicon nitride of charge-trapping material 44 may be formed by reacting nitrogen-containing precursor (i.e., nitrogen, or a nitrogen-containing compound, such as, for example, ammonia) with silicon atoms of surface 69 at an appropriate temperature (for instance, a temperature in excess of about 900° C.). The charge-trapping material 44 may be formed to any suitable thickness, such as, for example, a thickness within a range of from about 5 nm to about 10 nm.

The embodiment of FIGS. 5 and 6 activates surfaces of material 68 to induce selective formation of charge-trapping material 44 onto surfaces of material 68 relative to surfaces of material 66. Alternative or additional processing may include deactivation of surfaces of material 66. For instance, a barrier may be formed along surfaces of material 66 (for instance, by one or more of deposition of barrier material along surfaces 66, by chemical modification of the surfaces of material 66, by physical modification of the surfaces of material 66, etc.) to impede or preclude formation of charge-trapping material 44 along the surfaces of material 66.

The charge-trapping material 44 forms the vertically-spaced segments 43. Gaps 45 are along regions of material 66 between such vertically-spaced segments.

Figure 7:
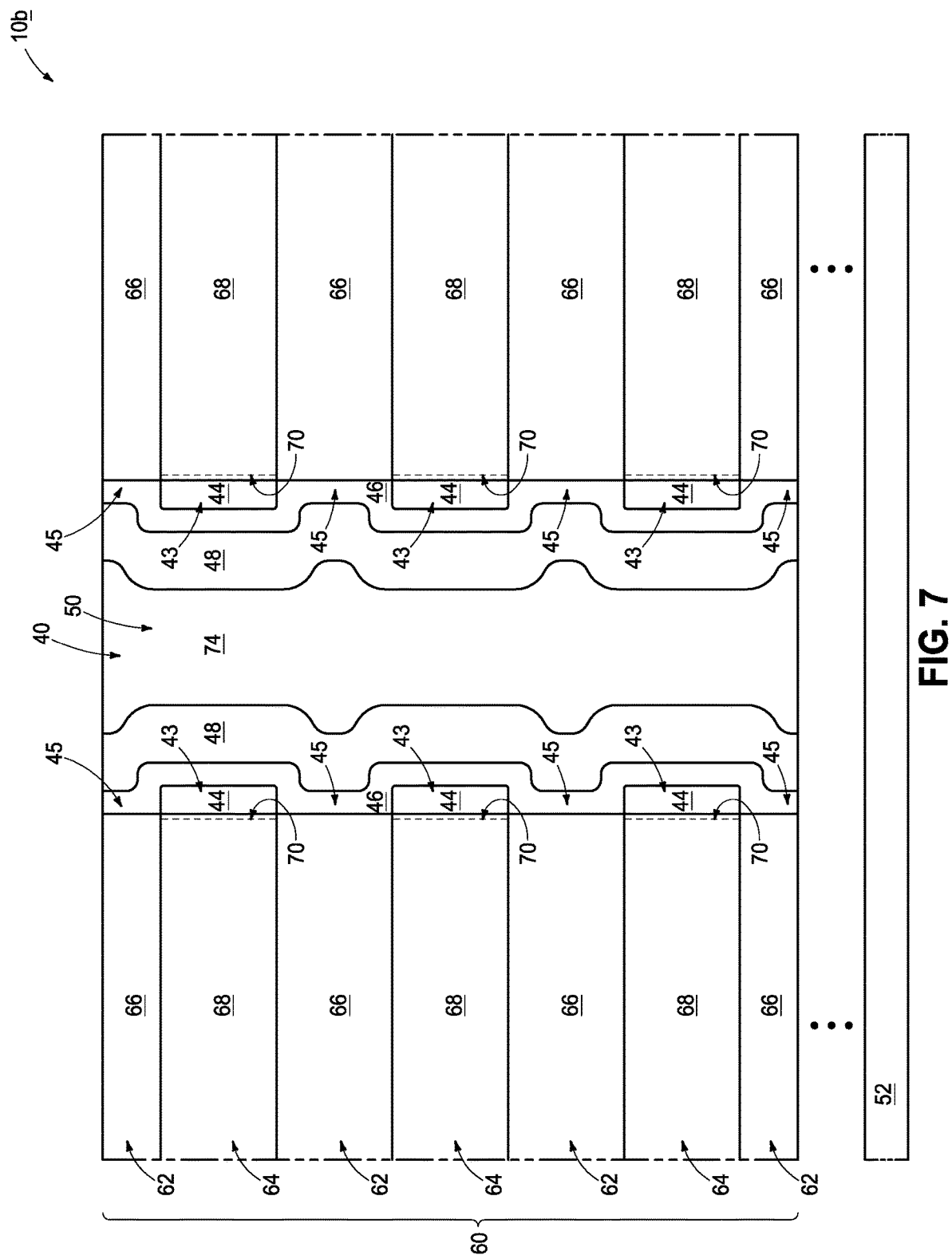

Referring to FIG. 7, charge-tunneling material 46 is formed to extend vertically along the first and second levels 62/64. The charge-tunneling material is along the charge-trapping material 44 (and is spaced from the material 68 of the second levels 64 by the charge-trapping material 44), and extends into the gaps 45.

Channel material 48 is formed to extend vertically along the charge-tunneling material 46.

Insulative material 74 is formed within a remaining central region of opening 40. The insulative material 74 forms the insulative region 50 described above with reference to FIG. 1; and may comprise any suitable composition or combination of compositions (such as, for example, silicon nitride, silicon dioxide, etc.). In some embodiments, the insulative material 74 may be omitted and a void may be left within the central region of opening 40. Alternatively, channel material 48 may be formed to entirely fill the opening 40.

Figure 8:
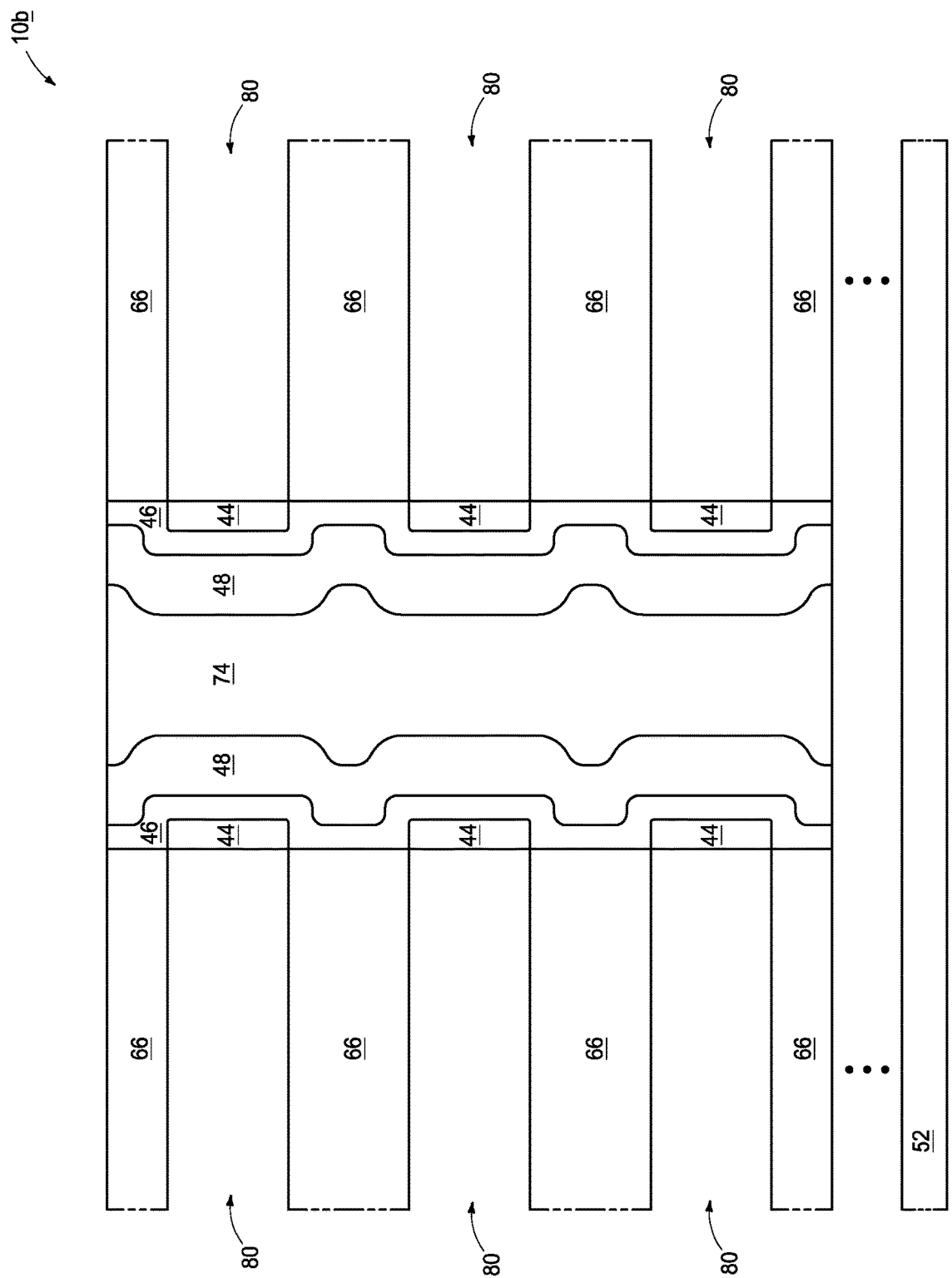

Referring to FIG. 8, the second material 68 (FIG. 7) is removed to leave voids 80. Such removal may be accomplished with any suitable etch which is selective for the second material 68 relative to the materials 44 and 66. For instance, if the second material 68 comprises polysilicon and the materials 44 and 66 comprise silicon nitride and silicon dioxide, respectively, the etch may utilize tetramethylammonium hydroxide (TMAH). In a processing step which is not shown, slits may be formed through stack 60 (FIG. 7) to provide access to the first and second levels 62/64 (FIG. 7). Etchant may be flowed into such slits to access the second material 68 (FIG. 7).

Figure 9:
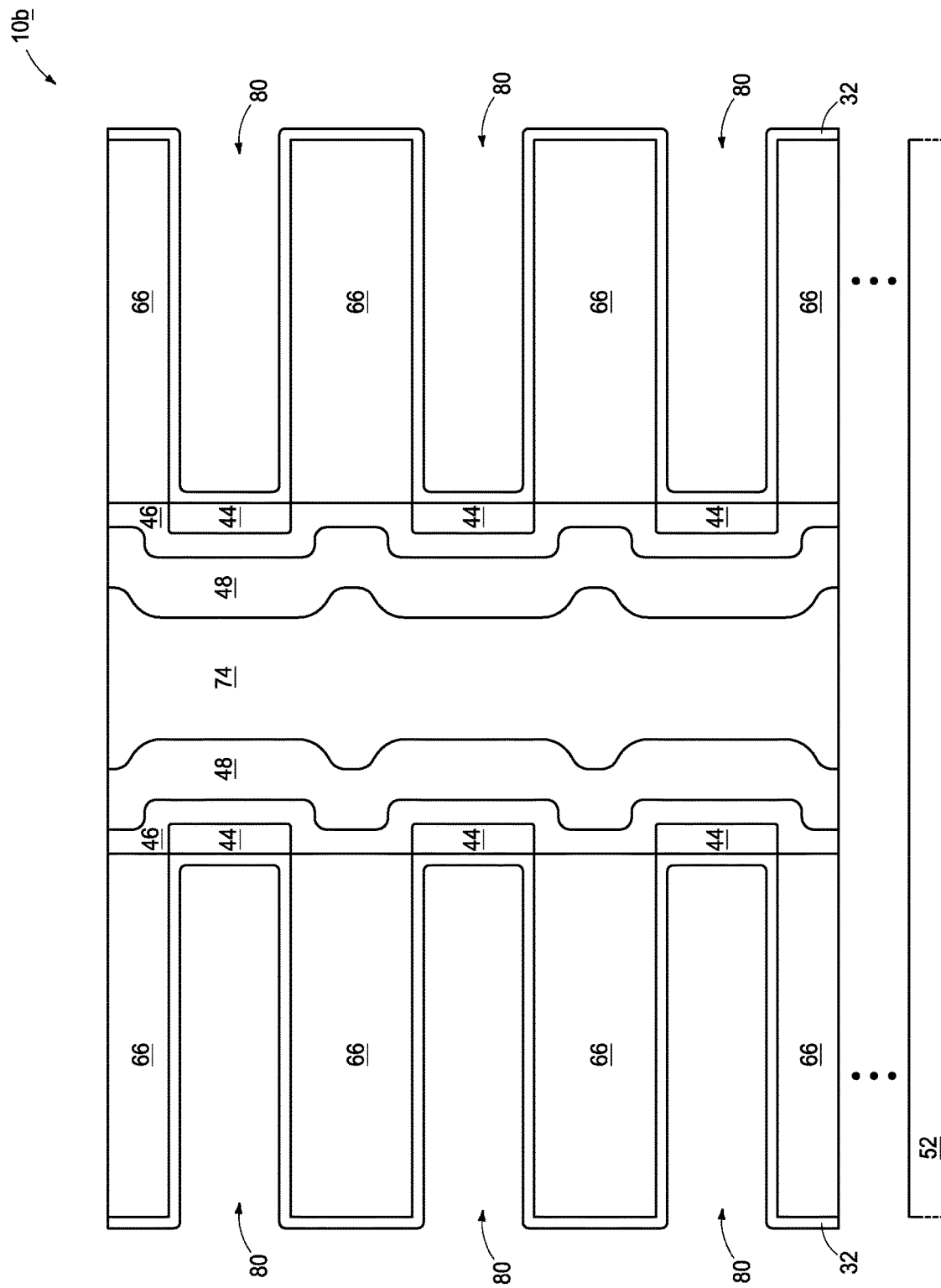

Referring to FIG. 9, insulative material 32 is formed within voids 80 to line the voids, and thereby become an insulative liner within the voids. The insulative material 32 may comprise high-k material (for instance, one or more of aluminum oxide, hafnium oxide, zirconium oxide, tantalum oxide, etc.) as discussed above with reference to FIG. 1, and may be referred to as a charge-blocking material.

Figure 10:
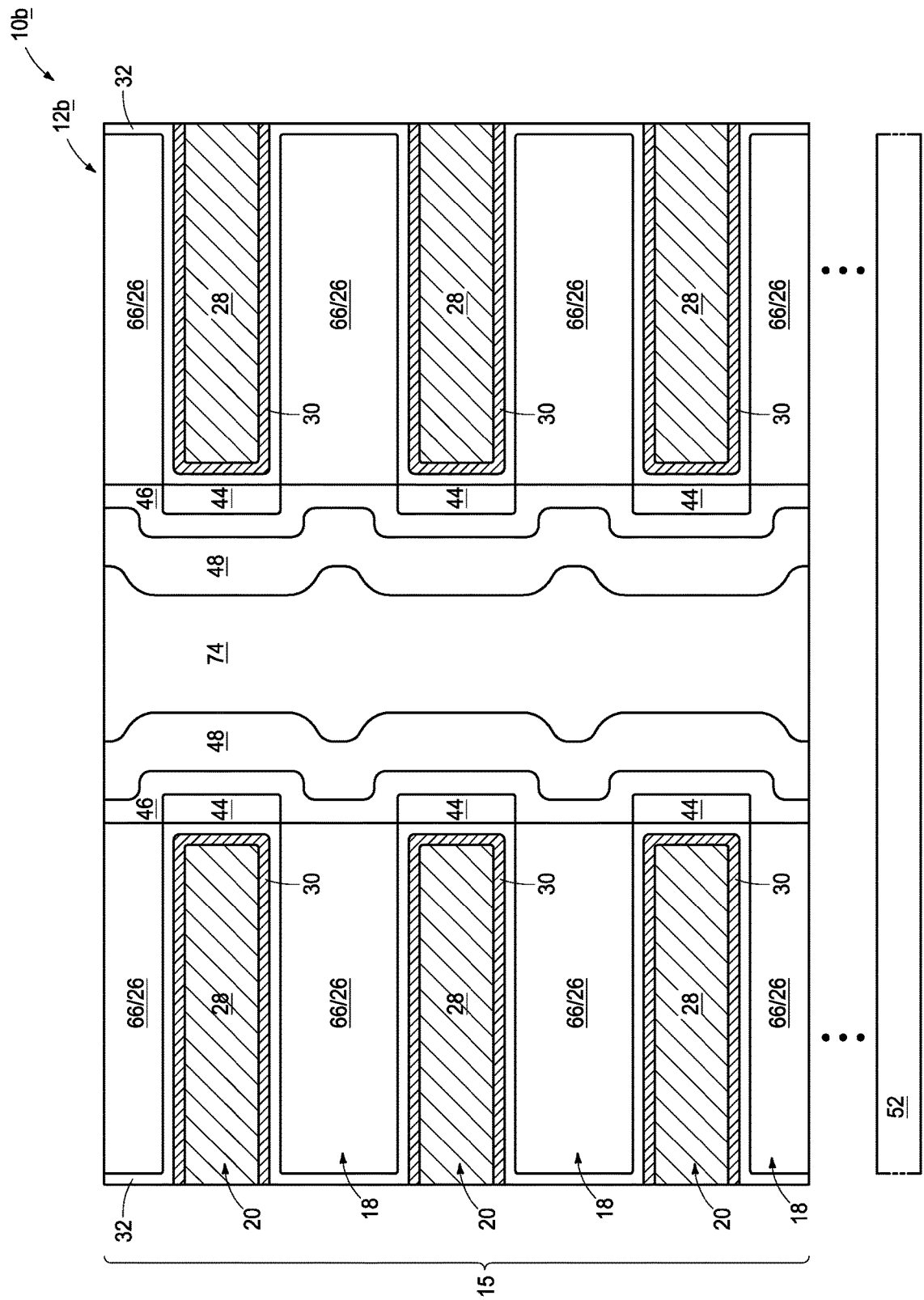

Referring to FIG. 10, conductive material 30 is formed within the lined voids 80 (FIG. 9), and then conductive material 28 is formed within the lined voids 80 (FIG. 9). The conductive material 28 may be considered to be a conductive core (as discussed above with reference to FIG. 1), and the conductive material 30 may be considered to be an outer conductive layer surrounding the conductive core (as is also discussed above with reference to FIG. 1).

The construction 10b of FIG. 10 comprises a NAND memory array 12b analogous to the NAND memory array 12 discussed above with reference to FIG. 1. The first material 66 may be the same as material 26 (e.g., may comprise silicon dioxide or other suitable insulative material) in some embodiments. Alternatively, the first material 66 may be removed and replaced with material 26 in some embodiments.

The insulative material 32 is shown extending along edges of insulative levels 18 in the shown embodiment of FIGS. 9 and 10, as may occur if the illustrated edges of insulative levels 18 are along a slit through which the insulative material 32 is deposited.

A second example embodiment method of fabricating a NAND memory array is described with reference to FIGS. 11-14.

Figure 11:
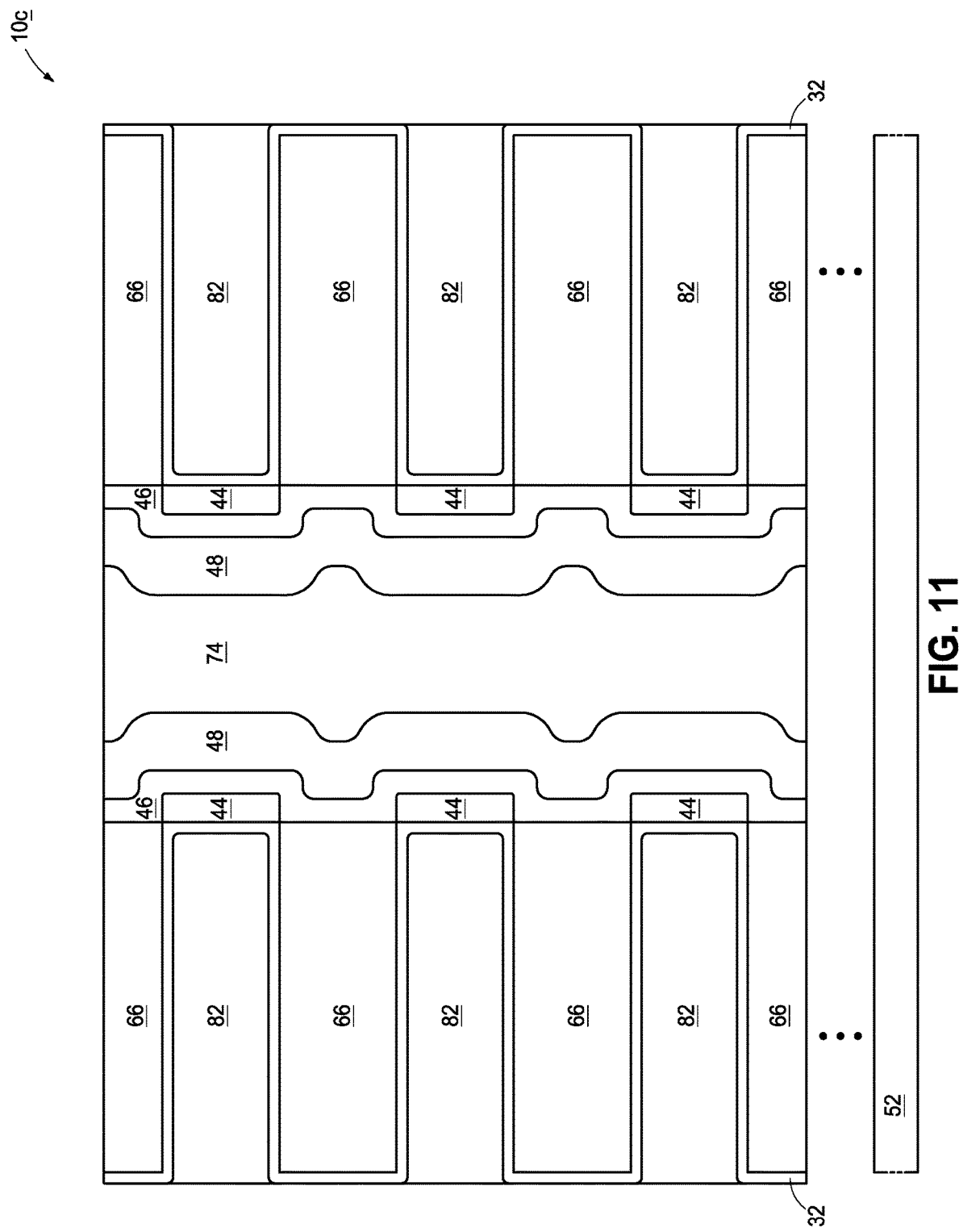
FIGS. 11-14 are diagrammatic cross-sectional side views of an example integrated structure at process stages of an example method. The process stage of FIG. 11 may follow that of FIG. 9.

Referring to FIG. 11, a construction 10c is shown at a processing stage following that of FIG. 9. The construction 10c is shown after the voids 80 (FIG. 9) are lined with insulative material 32. Subsequently, sacrificial material 82 is formed within the lined voids. The sacrificial material 80 may comprise any suitable composition or combination of compositions, such as, for example, silicon, germanium, etc.

Figure 12:
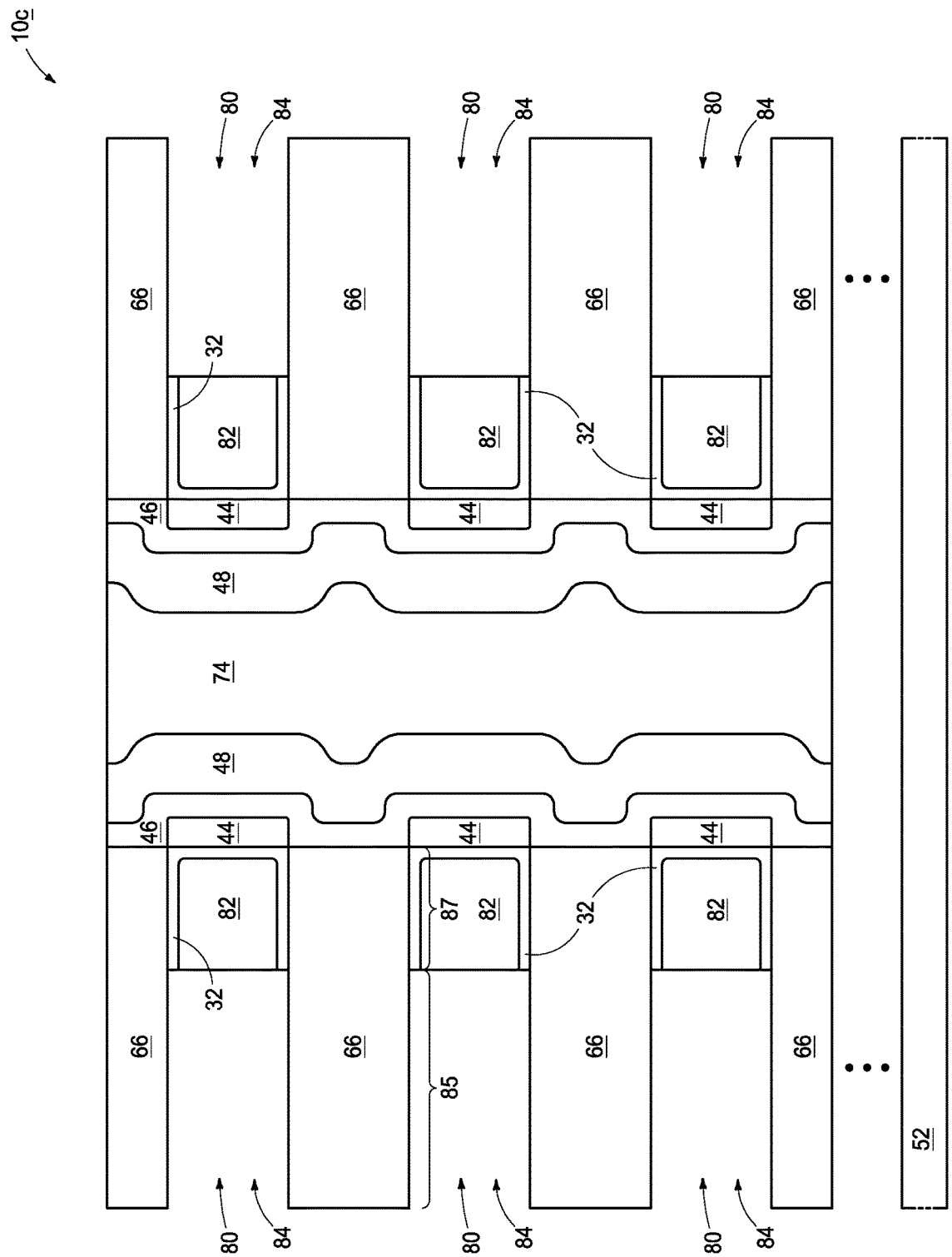

Referring to FIG. 12, the materials 82 and 32 are recessed to form cavities 84. After the materials 82 and 32 are recessed, regions that had been in voids 80 may be considered to comprise first segments 85 and second segments 87 (labeled relative to regions in only one of the voids 80 in order to simplify the drawing). The first segments 85 are not lined with material 32, and the second segments 87 remain lined with the insulative material 32.

Figure 13:
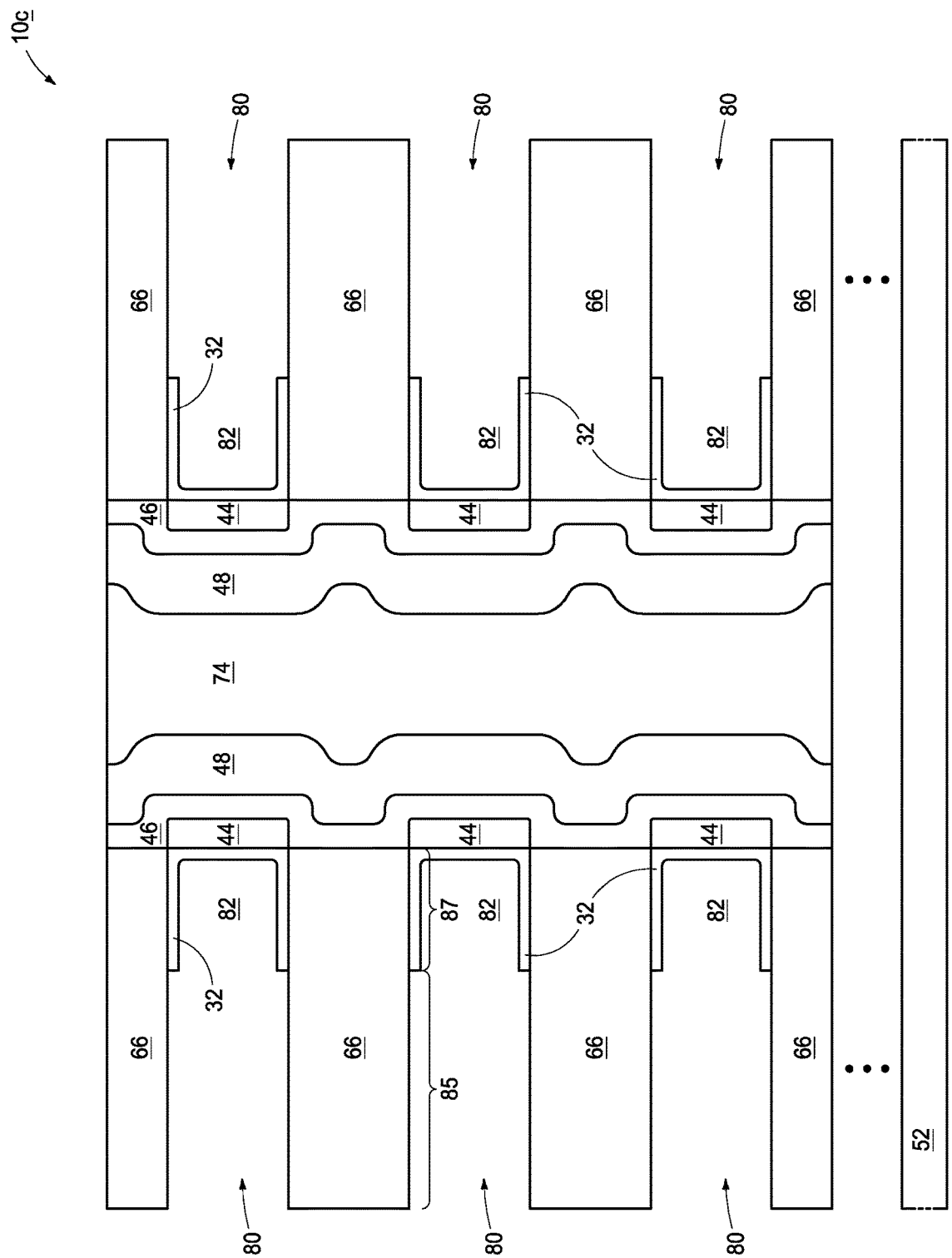

Referring to FIG. 13, remaining portions of sacrificial material 82 are removed.

Figure 14:
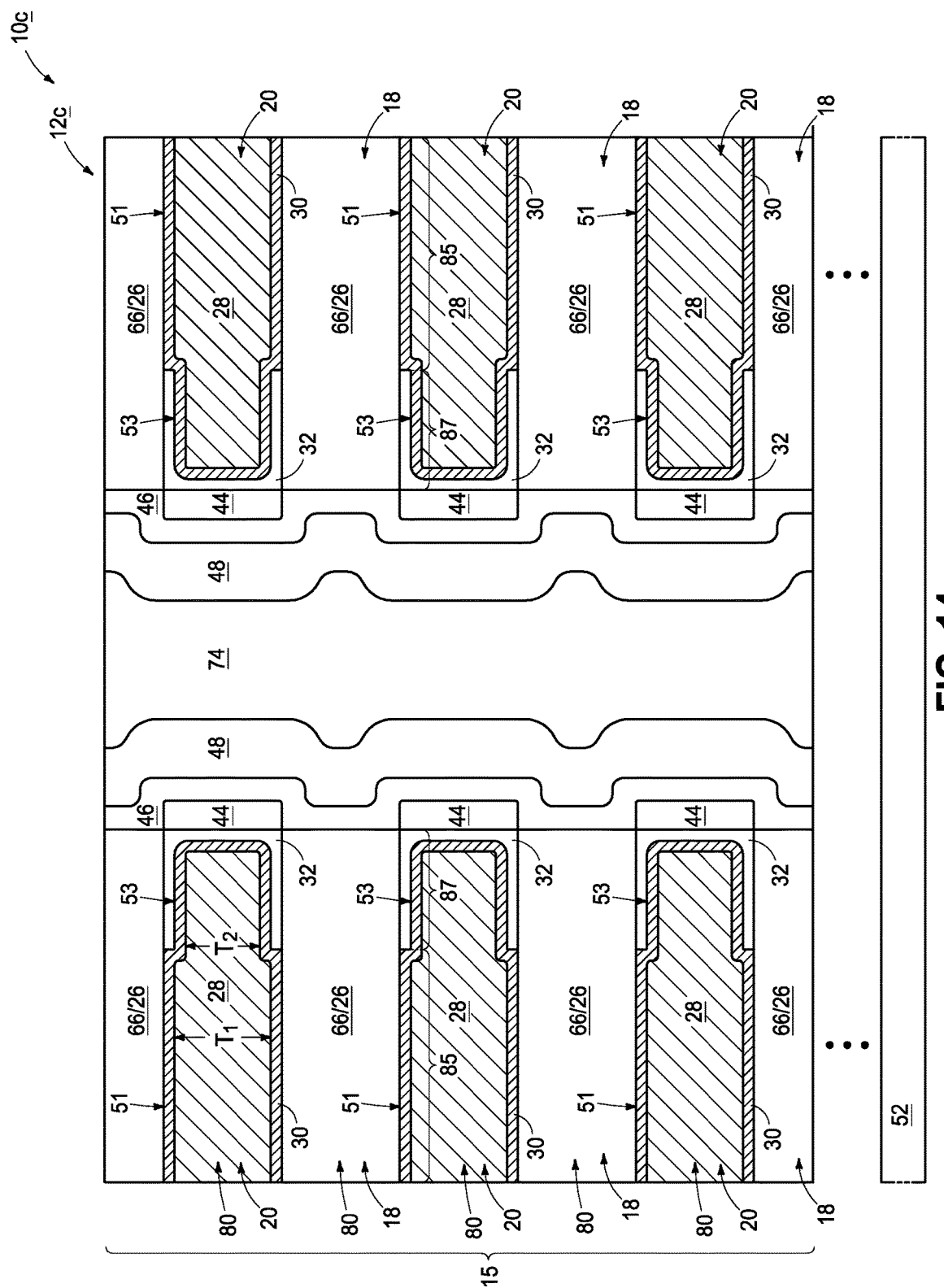

Referring to FIG. 14, the conductive levels 20 are formed, and in the shown embodiment the conductive levels 20 comprise the materials 28 and 30. The conductive levels 20 have the non-terminal regions 51 within the first segments 85, and have the terminal regions 53 within the second segments 87. The non-terminal regions 51 have the vertical thicknesses $T_1$, and the terminal regions 53 have the vertical thicknesses $T_2$, analogous to the embodiment described above with reference to FIG. 2. Accordingly, the construction 10c of FIG. 14 comprises a NAND memory array 12b analogous to the NAND memory array 12b discussed above with reference to FIG. 2. The first material 66 may be the same as material 26 (e.g., may comprise silicon dioxide or other suitable insulative material) in some embodiments. Alternatively, the first material 66 may be removed and replaced with material 26 in some embodiments.

The structures and arrays described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array which includes a vertical stack of alternating insulative levels and wordline levels. The wordline levels have terminal ends corresponding to control gate regions. Charge-trapping material is along the control gate regions of the wordline levels and not along the insulative levels. The charge-trapping material is spaced from the control gate regions by charge-blocking material. Channel material extends vertically along the stack and is laterally spaced from the charge-trapping material by dielectric material.

Some embodiments include a memory array comprising a vertical stack of alternating insulative levels and wordline levels. The wordline levels have terminal ends corresponding to control gate regions. A linear arrangement of charge-trapping material extends vertically along the stack. The linear arrangement of the charge-trapping material comprises vertically alternating segments of the charge-trapping material and segments of spacing material. The segments of charge-trapping material are along the wordline levels. Channel material extends vertically along the stack and is laterally spaced from the segments of the charge-trapping material by dielectric material.

Some embodiments include a NAND memory array comprising a vertical stack of alternating insulative levels and wordline levels. The wordline levels have terminal ends corresponding to control gate regions. Charge-trapping material is along the control gate regions of the wordline levels, and is spaced from the control gate regions by charge-blocking material. The charge-trapping material is configured as segments, with each of the wordline levels being adjacent one of the segments of the charge-trapping material. The segments of the charge-trapping material are arranged one atop another and are vertically spaced from one another by intervening gaps. The wordline levels have first regions and second regions laterally adjacent the first regions. The first regions are vertically thicker than the second regions. The second regions comprise the terminal ends. Channel material extends vertically along the stack and is laterally spaced from the charge-trapping material by charge-tunneling material.

Some embodiments include a method of forming a NAND memory array. A vertical stack of alternating first and second levels is formed. The first levels comprise first material, and the second levels comprise second material. The first and second levels have exposed surfaces along an opening extending through the first and second levels. Charge-trapping material is selectively formed along the exposed surfaces of the second levels relative to the exposed surfaces of the first levels. Charge-tunneling material is formed to extend vertically along the first and second levels, and is spaced from the second levels by the charge-trapping material. Channel material is formed to extend vertically along the charge-tunneling material. The second material is removed to leave voids. Conductive levels are formed within the voids. The conductive levels are wordline levels of the NAND memory array and have terminal ends corresponding to control gate regions.

Some embodiments include a method of forming a NAND memory array. A vertical stack of alternating first and second levels is formed. The first levels comprise silicon dioxide, and the second levels comprise silicon. The first and second levels have exposed surfaces along an opening extending through the first and second levels. The exposed surfaces of the second levels are treated with one or more of hydrogen, ammonia and fluorine. Charge-trapping material is selectively formed along the treated surfaces of the second levels relative to the exposed surfaces of the first levels. Charge-tunneling material is formed to extend vertically along the first and second levels, and is spaced from the second levels by the charge-trapping material. Channel material is formed to extend vertically along the charge-tunneling material. The silicon of the second levels is removed to leave voids. Metal-containing conductive levels are formed within the voids. The metal-containing conductive levels are wordline levels of the NAND memory array and have terminal ends corresponding to control gate regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A three-dimensional NAND memory array, comprising:
   a vertical stack of alternating insulative levels and conductive levels;
   vertically alternating segments of charge-trapping material and segments of spacing material along an opening in the vertical stack, the segments of charge-trapping material having upper surfaces in direct physical contact with spacing material comprised by the segments of spacing material; the segments of charge-trapping material being along the conductive levels and the segments of spacing material being along the insulative levels and directly against side surfaces of the charge-trapping material within the opening; and channel material within the opening extending vertically along the stack and being laterally spaced from the segments of the charge-trapping material by the spacer material.

2. The memory array of claim 1 wherein the spacer material comprises nitrogen-containing material laterally sandwiched between two oxide materials.

3. The memory array of claim 1 wherein the spacer material comprises silicon dioxide.

4. A NAND memory array, comprising:

a vertical stack of alternating first and second levels; the first levels comprising first material, and the second levels comprising a conductive core material and a conductive liner material lining the conductive core material and having terminal ends along an opening extending through the first and second levels, the terminal ends corresponding to control gate regions; the first and second levels all having sidewall surfaces along the opening;

segments of charge-trapping material along the sidewall surfaces of the second levels, the charge-trapping material being entirely within the opening;

charge-tunneling material extending along the first and second levels, and spaced from the second levels by the charge-trapping material, the segments of charge-trapping material having upper surfaces and lower in direct physical contact with the charge-tunneling material; and channel material within the opening extending along the charge-tunneling material.

5. The array of claim 4 wherein the charge-trapping material comprises one or more of silicon nitride, silicon oxynitride and ruthenium oxide.

6. The array of claim 4 wherein the charge-trapping material comprises silicon and nitrogen.

7. The array of claim 4 wherein the first material comprises silicon dioxide.

8. The array of claim 4 comprising high-k dielectric material lining the second levels.

9. The array of claim 4 wherein the second levels comprise one or more metals and/or metal-containing materials.

10. A vertical NAND memory string comprising:

a plurality of conductive levels with each individual conductive level comprised by the plurality of conductive levels being spaced from each adjacent conductive level by an intervening insulative level; each of the conductive levels and each of the intervening insulative levels having a terminal end along an opening;

segments of charge-blocking material along the terminal ends of the conductive levels;

segments of charge-trapping material along the terminal ends of the conductive levels and spaced from the terminal ends of the conductive levels by the charge-blocking material, the segments of charge-trapping material being vertically spaced from one another by a gap along the terminal end of the corresponding intervening insulative level; and segments of charge-trapping material within the gap and in direct physical contact with upper and lower surfaces of the segments of charge-trapping material.

11. The memory string of claim 10 wherein the segments of charge-trapping material partially overlap the intervening insulative levels.

12. The memory string of claim 10 wherein the segments of charge-trapping material do not overlap the intervening insulative levels.

13. The memory string of claim 10 wherein the charge-tunneling material also extends vertically along the charge-trapping material.

14. The memory string of claim 13 wherein the charge-tunneling material consists of silicon oxide.

15. The memory string of claim 13 further comprising a channel material along and directly against the charge-tunneling material.

16. The memory string of claim 15 wherein the channel material is conductively doped silicon.

17. The memory string of claim 10 wherein the terminal ends of the conductive levels function as control gate regions of NAND memory cells.

* * * * *

UNITED STATES PATENT AND TRADEMARK OFFICE
CERTIFICATE OF CORRECTION

PATENT NO. : 10,541,252 B2
APPLICATION NO. : 16/410973
DATED : January 21, 2020
INVENTOR(S) : David Daycock et al.

Page 1 of 1

It is certified that error appears in the above-identified patent and that said Letters Patent is hereby corrected as shown below:

In the Claims

Column 12, Claim 10, Line 20 - Replace "charge-trapping material" with --charge-tunneling material--

Signed and Sealed this
Twenty-fourth Day of March, 2020

Andrei Iancu
*Director of the United States Patent and Trademark Office*